United States Patent [19]

Oetzmann

[11] Patent Number: 5,196,804
[45] Date of Patent: Mar. 23, 1993

[54] PHASE DETECTORS

[75] Inventor: Emerson H. Oetzmann, Kent, England

[73] Assignee: Marconi Avionics Limited, England

[21] Appl. No.: 588,445

[22] Filed: Jan. 23, 1984

[51] Int. Cl.⁵ .............................................. H03B 3/04
[52] U.S. Cl. .................................... 328/133; 328/134; 328/155; 324/76.82; 324/76.83
[58] Field of Search ........................ 328/133, 134, 155; 324/83 A, 83 D

[56] References Cited

U.S. PATENT DOCUMENTS

| | | | |
|---|---|---|---|
| 3,469,196 | 9/1969 | Cowin et al. | 328/133 |
| 3,659,210 | 4/1972 | Nilsson | 328/134 X |
| 3,771,063 | 11/1973 | Barrett | 328/134 |
| 3,940,693 | 2/1976 | Brown | 324/83 A |
| 4,151,473 | 4/1979 | Coleman et al. | 328/134 |
| 4,358,736 | 11/1982 | DeBoer | 328/133 |

Primary Examiner—Mark Hellner
Attorney, Agent, or Firm—Kirschstein, Ottinger, Israel & Schiffmiller

[57] ABSTRACT

A phase detector for producing an output signal indicative of the relative phase of periodic transitions in a first signal and a further periodic signal comprising: a smoothing circuit (33); a variable gain amplifier (31) via which the first signal is applied to the smoothing circuit; and a control circuit (35) for varying the gain of the amplifier cyclically between positive and negative values at the frequency of the further signal.

The detector finds particular application in a phase locked loop arrangement whereby a periodic signal generator is phase locked to periodic transitions occurring between an adjacent pair of channels in each frame of a multiplex time division signal, the other frames of which contain analogue data. The gain of the amplifier is then suitably varied in steps of equal magnitude between positive and negative values of equal magnitude, the time between adjacent steps being equal and the number of steps being equal to the number of channels in a frame.

11 Claims, 2 Drawing Sheets

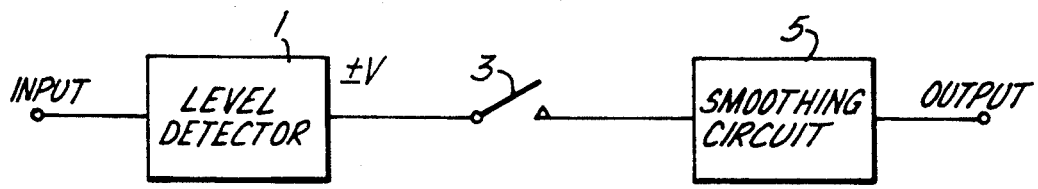
Fig. 1.
(PRIOR ART)
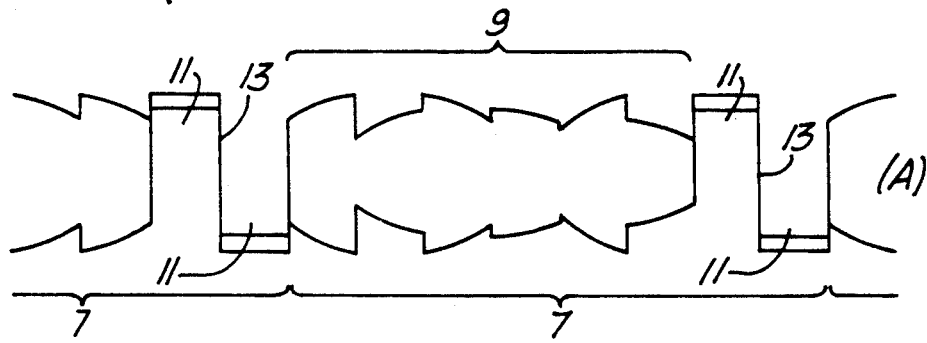
Fig. 2.
(PRIOR ART)
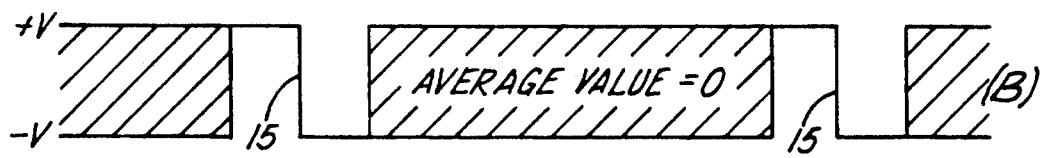
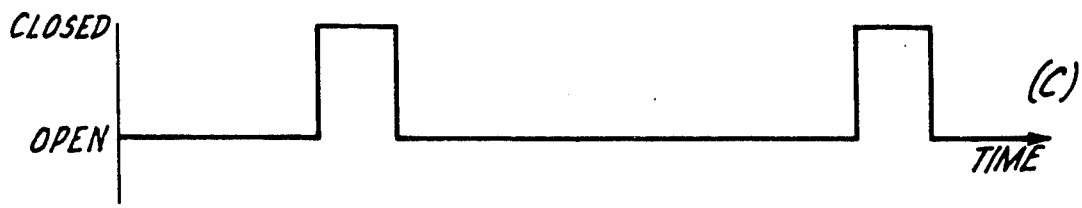
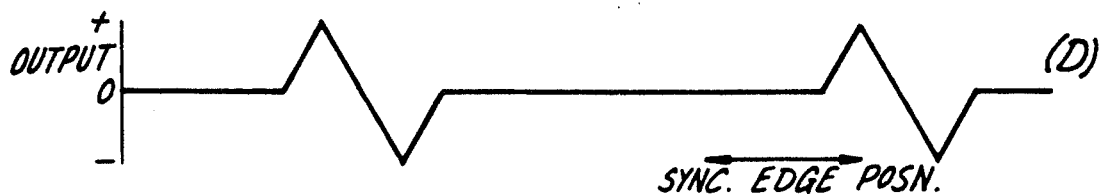

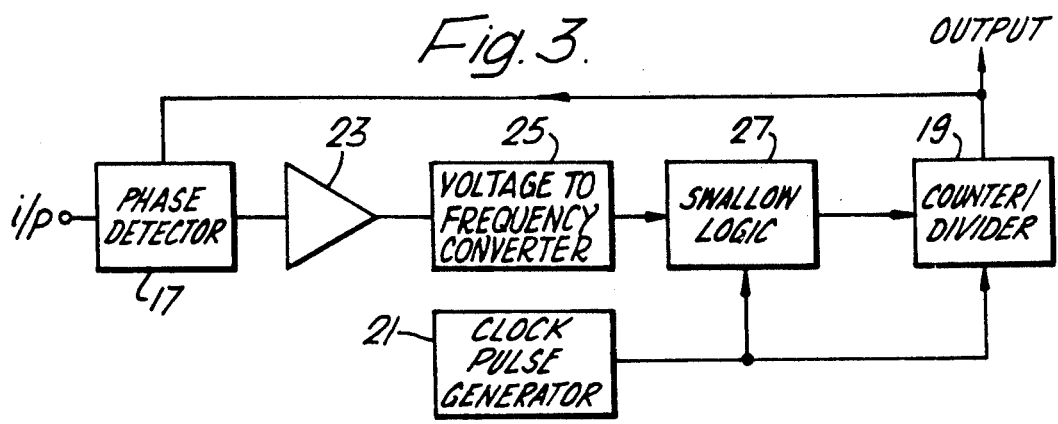
Fig. 3.
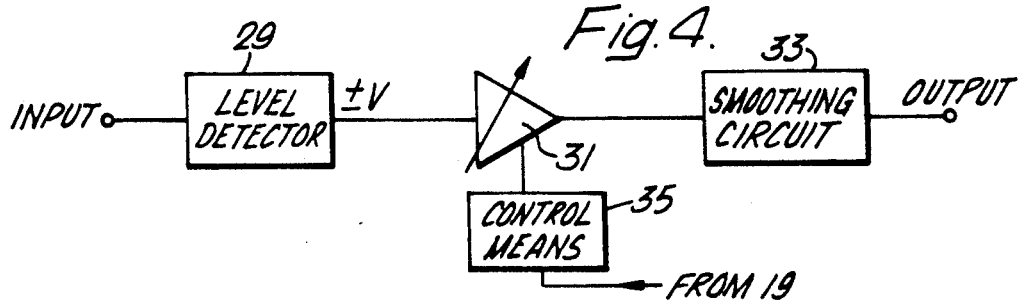
Fig. 4.
Fig. 5.
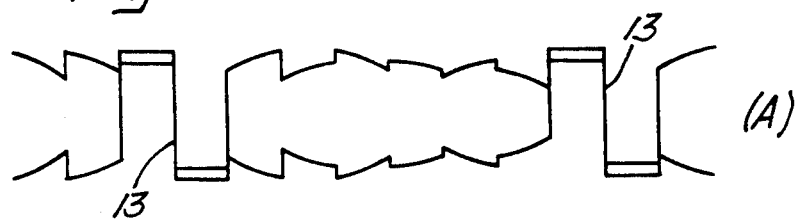
(A)
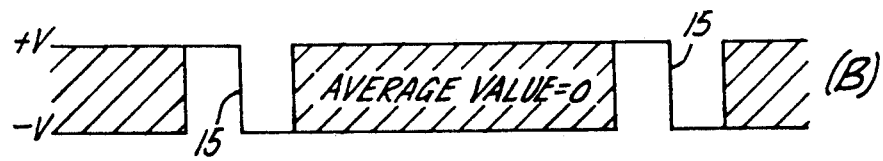
(B)
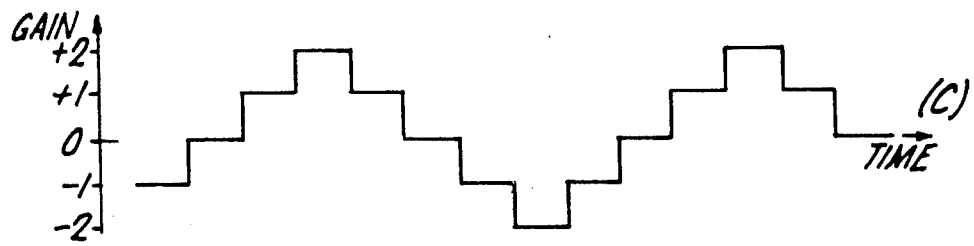
(C)
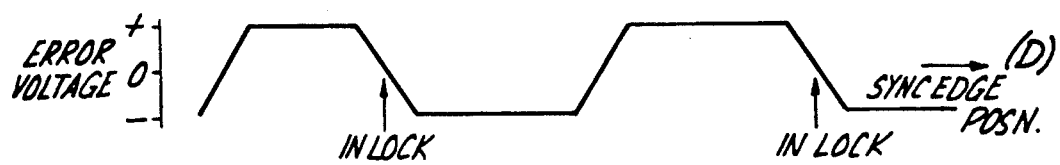
(D)

PHASE DETECTORS

BACKGROUND OF THE INVENTION

1. Description of the Invention

This invention relates to phase detectors.

More particularly the invention relates to phase detectors suitable for use in phase locked loop arrangements of the kind adapted to produce a reference signal locked to the frame repetition frequency of a multiplex time division signal comprising frames consisting of a plurality of channels containing analogue data and a pair of adjacent channels containing pedestal voltages of different values. The different valued pedestal voltages provide a voltage transition for synchronising purposes, i.e. a sync edge. Digital or analogue data may also be encoded into the channels containing the pedestal voltages, providing the sync edge is retained.

2. Description of Related Art

A known form of such a phase detector will now be described with reference to FIGS. 1 and 2 of the accompanying drawings in which:

FIG. 1 is a schematic circuit diagram of the phase detector according to the prior art; and FIGS. 2A to 2D are diagrams illustrating the operation of the prior art phase detector of FIG. 1.

FIGS. 3, 4 and 5 show the present invention.

The phase detector includes a level detector 1 which provides an output voltage of $+V$ or $-V$ according to whether its input is positive or negative.

The output of the level detector 1 is passed via a switch 3 to a smoothing circuit 5 whose output constitutes the output of the phase detector circuit.

The switch 3 is operated under control of a reference signal as described in further detail below.

Referring now to FIG. 2, the input signal of the level detector 1 comprises a multiplex time division signal (see FIG. 2A) having a waveform consisting of successive frames 7 each comprising eight channels. In each frame six successive channels 9 contain alternating voltage analogue data and the other two channels 11 contain digital data encoded on respective pedestal voltages of opposite polarity, the two digital data channels thus lying on opposite sides of a sync edge 13.

The output of the level detector (see FIG. 2B), which effectively comprises a hard-clipped version of the input signal, includes a sync edge 15 corresponding to the sync edge 13 in the input signal immediately preceded and succeeded by positive and negative voltages $+V$ and $-V$ respectively for a period equal to the input signal channel period. However, during the analogue data channels, the output of the level detector 1 will be indeterminate with an average value of zero.

The switch 3 is controlled by a signal of waveform shown in FIG. 2C so as to be closed for a short period during each frame of the input signal, e.g. for a channel period. When the switch is closed for periods centred on the sync edge 15, as illustrated by FIGS. 2B and 2C, then positive and negative voltages $+V$ and $-V$ are supplied by the detector 1 to the smoothing circuit 5 for equal periods giving a net zero output. If on the other hand the sync edge 15 moves from the centre position the output of the smoothing circuit 5 will have a net positive or negative value according to the direction of, movement of the sync edge 15. Thus the phase detector output has a characteristic of the form illustrated in FIG. 2D.

It will be appreciated that when used in a phase locked loop arrangement, the output of the phase detector is utilised to produce an error voltage to control the reference signal source so that the reference signal is phase-locked to the frame repetition rate of the data signal.

The disadvantage of a phase detector of the form shown in FIG. 1 is that in the unlocked condition the periods of closure of the switch 3 may occur wholly during reception of analogue data signals. The phase detector output will then have a net zero value and acquisition of lock will not occur at least until the phase of the reference signal source drifts to a point when the period of closure of switch 3 overlaps the period when a sync edge 13 is being received.

SUMMARY OF THE INVENTION

It is an object of the present invention to provide a phase detector whereby this disadvantage is overcome.

According to the present invention there is provided a phase detector for producing an output signal indicative of the relative phase of periodic transitions in a first signal and a further periodic signal, the detector comprising: a smoothing circuit; a variable gain amplifier means via which the first signal is applied to the smoothing circuit; and means for varying the gain of the amplifier means cyclically between positive and negative values at the frequency of said further signal.

Preferably said means for varying the gain of the amplifier means is arranged to vary said gain in steps, the steps suitably being of substantially equal magnitude, and the time between each adjacent pair of steps suitably being substantially the same.

Said positive and negative values of the gain of the amplifier means are suitably of substantially equal magnitude.

Normally a phase detector in accordance with the invention will further include level detector means via which the first signal is applied to the input of the variable gain amplifier means so that the signal at the input of the amplifier means is a hard-clipped version of said input signal.

The invention further provides a phase locked loop arrangement comprising: periodic signal generator means; phase detector means comprising a smoothing circuit, variable gain amplifier means via which an input signal is applied to the smoothing circuit, and means for varying the gain of the amplifier means cyclically between positive and negative values at the frequency of the output of said signal generator means; and means for utilising the output of the smoothing circuit to control the output of the signal generator means, thereby to lock the output of the signal generator means to periodic transitions occurring in the input signal.

In a preferred form of phase locked loop arrangement in accordance with the invention for use where said input signal is a multiplex time division signal comprising frames each consisting of a plurality of channels between an adjacent pair of which a said transition occurs, the gain the amplifier means is arranged to vary between positive and negative values of substantially equal magnitude and back again in steps of substantially equal magnitude, the time between each adjacent pair of steps being substantially equal and the number of steps being equal to the number of channels in a frame of said input signal.

Normally a phase locked loop arrangement in accordance with the invention will further include level detector means via which said input signal is applied to the input of variable gain amplifier means so that the signal at the input of said amplifier means is a hard-clipped version of said input signal.

BRIEF DESCRIPTION OF THE DRAWINGS

One phase-locked loop arrangement in accordance with the invention incorporating a phase detector in accordance with the invention will now be described, by way of example, with reference to FIGS 3 to 5 of the accompanying drawings in which:

FIG. 3 is a block schematic diagram of the phase locked loop arrangement;

FIG. 4 is a block schematic diagram of the phase detector; and

FIGS. 5A to 5D illustrate the operation of the phase detector of FIG. 2.

DETAILED DESCRIPTION OF THE PREFERRED EMBODIMENT

Referring to FIG. 3, the phase locked loop arrangement comprises a phase detector 17 to one input of which is applied a multiplex time division signal of the form illustrated in FIG. 5A and described above with reference to FIG. 2A.

The other input of the phase detector 17 is derived from a counter/divider 19 to which clock pulses are supplied from a crystal controlled clock pulse generator 21. The input to the phase detector 17 derived from the counter/divider 19 is arranged to have, when the loop is not operating, a frequency slightly above the frame repetition frequency of the input signal applied to the other input of the phase detector 17.

The output of the phase detector 17, which constitutes a loop error signal, is applied by way of a shaping and amplifying stage 23 to a voltage-to-frequency converter 25 in the form of a voltage controlled oscillator.

The output of the converter 25 is applied to a logic circuit 27 which performs a so-called swallow logic function in respect of clock pulses applied to the counter/divider 19, thereby to inhibit the count of the counter/divider 19 for one clock period for each cycle of the voltage-to-frequency converter output.

The stage 23 performs, inter alia, an integrating function. Hence, in operation of the arrangement the error signal at the output of the detector 17 causes a continuing increase in the output of the stage 23, and hence in the frequency of the converter output. Consequently the frequency of the counter/divider output decreases to become substantially equal to the frame repetition frequency of the input signal.

As will now be explained in detail, the phase detector is arranged so that the phase of the counter/divider output then rapidly locks to the phase of the input signal frame repetition frequency.

Referring now to FIG. 4 the phase detector 17 includes a level detector 29 to whose input the multiplex time division input signal is applied. The output of the level detector (see FIG. 5B) effectively comprises a hard-clipped version of its input signal, as described above with reference to FIG. 2B.

The phase detector 17 further includes a variable gain amplifier 31 via which the level detector output is passed to a smoothing circuit 33.

The gain of the amplifier 31 is controlled by control means 35 in dependence on a signal derived from the counter/divider 19 so as to vary from a value of +2 to a value of −2 and back again in steps of unity gain at equal time spacing during each cycle of the counter/divider output, thus providing a gain sequence as illustrated in FIG. 5C. It will be appreciated that in the present context a negative gain means that an amplifier output is inverted with respect to its output when the gain is positive.

With this gain sequence, the variation of the phase detector output with the position of the sync edge 15 relative to the gain sequence, i.e. the phase detector characteristic, is as illustrated in FIG. 5D. This can be explained as follows.

Since the average value of the level detector output during the analogue data channels is zero, these channels make no contribution to the phase detector output.

When the sync edge 15 occurs at the centre of the period when the gain of the amplifier 31 is +2, then the gain of the amplifier 31 applied to the positive and negative level detector outputs on opposite sides of the sync edge 13 is the same, and the contributions to the phase detector output from positive and negative level detector outputs are equal and opposite and the phase detector output is zero. If, however, the sync edge 15 moves from this central position, then the gain of the amplifier 31 applied to the positive level detector output is different from the gain of the amplifier 31 applied to the negative level detector output. Hence the phase detector output assumes a net positive or negative value, depending on the direction of movement of the sync edge.

Thus the phase detector 17 provides an error voltage, as shown in FIG. 5D, which drives the loop into a null position in which the sync edge 15 occurs at the centre of the period when the amplifier gain is +2. Moreover, such an error voltage is provided by the phase detector 17 for all relative phases of the input signal and the counter/divider output except when these signals are exactly 180° out of phase. However, it will be appreciated that this latter condition is highly unstable and will not prevent rapid acquisition of the desired phase-locked condition of the counter/divider output to the frame repetition frequency of the input signal.

It will be appreciated that having achieved phase lock, an output from the counter/divider will be utilised for purposes such as demultiplexing the input signal.

It will be seen that in the arrangement described above, by way of example, the number of steps in the variation of the gain of the amplifier is equal to the number of channels in a frame of the input signal. A smaller number of gain steps will clearly be unsatisfactory since the detector output will then have a sawtooth waveform, and if the gain steps have a time spacing equal to or exceeding two channel periods, exhibit undesired zeros. However, a larger number of gain steps, or even a continuously varying gain e.g. a gain variation of ramp form would be satisfactory although this would in general produce non linear variations in phase detector output and/or smaller phase detector outputs.

It will be understood that in the arrangement described above by way of example, phase lock will occur when the sync edge 15 occurs at the centre of the period when the gain of amplifier 31 is −2 if the sense of the feedback in the phase locked loop is reversed.

I claim:

1. A phase detector for producing an output signal indicative of the relative phase of a multiplex time division input signal comprising frames each consisting of a plurality of channels containing analogue data and a pair of adjacent channels containing pedestal voltages of different values to provide a voltage transition for synchronizing purposes, and a further periodic signal, the detector comprising: a smoothing circuit; a variable gain amplifier means via which the input signal is applied to the smoothing circuit; and means for varying the gain of the amplifier means cyclically in steps between positive and negative values at the frequency of said further signal, the number of steps per cycle being at least as great as the number of channels in a frame of said input signal.

2. A phase detector for producing an output signal indicative of the relative phase of periodic transitions in a first signal and a further periodic signal, the detector comprising: a smoothing circuit; a variable gain amplifier means via which the first signal is applied to the smoothing circuit; and means for varying the gain of the amplifier means cyclically between positive and negative values at the frequency of said further signal, said means for varying the gain of the amplifier means producing a gain variation of ramp form.

3. A phase locked loop arrangement comprising: a periodic signal generator means; a phase detector means comprising a smoothing circuit, a variable gain amplifier means via which there is applied to said smoothing circuit a multiplex time division input signal comprising frames each consisting of a plurality of channels containing analogue data and a pair of adjacent channels containing pedestal voltages of different values to provide a voltage transition for synchronizing purposes; and means for varying the gain of the amplifier means cyclically in steps between positive and negative values at the frequency of the output of said signal generator means, the number of steps per cycle being at least as great as the number of channels in a frame of said input signal; and means for utilizing the output of the smoothing circuit to control the output of the signal generator means, thereby to lock the output of the signal generator means to said transitions in the input signal.

4. A phase locked loop arrangement comprising: a periodic signal generator means; phase detector means comprising a smoothing circuit; variable gain amplifier means via which an input signal is applied to the smoothing circuit; and means for varying the gain of the amplifier means cyclically between positive and negative values at the frequency of the output of said signal generator means, said means for varying the gain of the amplifier means producing a gain variation of ramp form; and means for utilizing the output of the smoothing circuit to control the output of the signal generator means, thereby to lock the output of the signal generator means to periodic transitions occurring in the input signal.

5. A phase detector according to claim 1 wherein said steps are of substantially equal magnitude.

6. A phase detector according to claim 5 wherein the time between each adjacent pair of said steps is substantially the same.

7. A phase detector according to claim 1 wherein said positive and negative values of the gain of the amplifier means are of substantially equal magnitude.

8. A phase locked loop arrangement according to claim 3 wherein said steps are of substantially equal magnitude.

9. A phase locked loop arrangement according to claim 8 wherein the time between each adjacent pair of said steps is substantially the same.

10. A phase locked loop arrangement according to claim 3 wherein said positive and negative values of the gain of the amplifier means are of substantially equal magnitude.

11. A phase locked loop arrangement according to claim 3 wherein said signal generator means comprises a counter/divider means and a clock pulse generator which supplies pulses to the input of the counter/divider means at a frequency such that in the absence of an output from the smoothing circuit the output of the counter/divider means has a frequency greater than the frequency of said transition in the input signal; and said means for utilising the output of the smoothing circuit comprises a voltage to frequency converter means responsive to the integral of the output of the smoothing circuit, and logic means responsive to the output of the converter means to prevent the application of at least one clock pulse to the input of the counter/divider means in response to each cycle of the output of the converter means.

* * * * *